United States Patent
Tian et al.

(10) Patent No.: US 12,363,866 B2
(45) Date of Patent: Jul. 15, 2025

(54) HEAT DISSIPATION DEVICE AND ELECTRONIC APPARATUS

(71) Applicant: Lenovo (Beijing) Limited, Beijing (CN)

(72) Inventors: Ting Tian, Beijing (CN); Xin He, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 225 days.

(21) Appl. No.: 17/691,087

(22) Filed: Mar. 9, 2022

(65) Prior Publication Data

US 2023/0102407 A1    Mar. 30, 2023

(30) Foreign Application Priority Data

Sep. 27, 2021   (CN) .......................... 202111133587.X

(51) Int. Cl.
*H05K 7/20*    (2006.01)
*F28D 15/04*   (2006.01)

(52) U.S. Cl.
CPC ......... *H05K 7/20336* (2013.01); *F28D 15/04* (2013.01)

(58) Field of Classification Search
CPC .......... H05K 7/20336; H05K 7/20309; H05K 7/2029; F28D 15/04
See application file for complete search history.

(56) References Cited

U.S. PATENT DOCUMENTS

| | | | | |
|---|---|---|---|---|
| 6,659,168 B1* | 12/2003 | Barsun | ................ | H01L 23/3672 |
| | | | | 257/E23.103 |
| 7,040,383 B2* | 5/2006 | Oyamada | ........... | H05K 7/20436 |
| | | | | 165/80.4 |
| 7,926,982 B2* | 4/2011 | Liu | .......................... | F21V 29/75 |
| | | | | 362/249.02 |
| 9,490,188 B2* | 11/2016 | Arvelo | .................... | H01L 23/42 |
| 9,625,220 B1* | 4/2017 | Ahbel | ..................... | H01L 23/34 |

(Continued)

FOREIGN PATENT DOCUMENTS

| | | |
|---|---|---|
| CN | 103712496 A | 4/2014 |
| CN | 107548262 A | 1/2018 |

(Continued)

OTHER PUBLICATIONS

JP-2000161879-A Translation.*
CN-109378303-A Translation.*

*Primary Examiner* — Jayprakash N Gandhi
*Assistant Examiner* — Matthew Sinclair Muir
(74) *Attorney, Agent, or Firm* — ANOVA LAW GROUP, PLLC

(57) ABSTRACT

A heat dissipation device includes a vapor chamber including a heat absorption plate body, a vacuum cavity, and a heat dissipation area arranged in sequence. The heat absorption plate body is configured to be connected to a heat generation device. A three-dimensional heat dissipation structure is disposed in the vacuum cavity. A gap exists between an end of the heat dissipation structure and an inner wall of the vacuum cavity. A capillary structure is provided at the inner wall of the vacuum cavity and the three-dimensional heat dissipation structure. The capillary structure is configured to accommodate heat dissipation liquid. The heat dissipation area is configured to reduce a temperature of heat dissipation vapor corresponding to the heat dissipation liquid.

13 Claims, 4 Drawing Sheets

(56) References Cited

U.S. PATENT DOCUMENTS

| | | | |
|---|---|---|---|
| 10,859,330 B1* | 12/2020 | Cola | H02S 40/42 |
| 2006/0196640 A1* | 9/2006 | Siu | H01L 23/473 |
| | | | 257/E23.103 |
| 2007/0056712 A1* | 3/2007 | Yu | F28D 15/0233 |
| | | | 165/104.21 |
| 2007/0102143 A1 | 5/2007 | Yu et al. | |
| 2007/0102147 A1* | 5/2007 | Chang | H01L 21/4878 |
| | | | 165/185 |
| 2023/0032004 A1* | 2/2023 | Jung | H05K 7/20336 |
| 2023/0232589 A1* | 7/2023 | Sugahara | H05K 7/20854 |
| | | | 361/697 |

FOREIGN PATENT DOCUMENTS

| | | | | |
|---|---|---|---|---|
| CN | 109378303 A | * | 2/2019 | H01L 23/427 |
| CN | 211696010 U | | 10/2020 | |
| CN | 213873937 U | | 8/2021 | |
| EP | 3633305 A1 | | 4/2020 | |
| JP | 2000161879 A | * | 6/2000 | |

\* cited by examiner

HEAT DISSIPATION DEVICE AND ELECTRONIC APPARATUS

CROSS-REFERENCE TO RELATED APPLICATION

This application claims priority to Chinese Patent Application No. 202111133587.X, filed on Sep. 27, 2021, the content of which is incorporated herein by reference in its entirety.

TECHNICAL FIELD

The present disclosure generally relates to the field of mechanical technologies and, more particularly, to a heat dissipation device and an electronic apparatus.

BACKGROUND

An electronic apparatus generates heat during data operations, and higher temperature affects operating performance of the electronic apparatus. To enable the electronic apparatus to operate efficiently, the electronic apparatus needs to be cooled. A cold plate is a device used for liquid cooling and heat dissipation of an electronic apparatus. A plurality of channels for cooling liquid to flow is provided in the cold plate. When heat of a heat generation device is conducted to the cold plate, the heat is absorbed by the cooling liquid inside the cold plate, enters an external cooling circulation system with flow of the cooling liquid and dissipates to outside.

However, heat dissipation capacity of existing cold plates is limited, and the heat dissipation capacity of a cold plate needs to be improved.

SUMMARY

In accordance with the disclosure, there is provided a heat dissipation device including a vapor chamber including a heat absorption plate body, a vacuum cavity, and a heat dissipation area arranged in sequence. The heat absorption plate body is configured to be connected to a heat generation device. A three-dimensional heat dissipation structure is disposed in the vacuum cavity. A gap exists between an end of the heat dissipation structure and an inner wall of the vacuum cavity. A capillary structure is provided at the inner wall of the vacuum cavity and the three-dimensional heat dissipation structure. The capillary structure is configured to accommodate heat dissipation liquid. The heat dissipation area is configured to reduce a temperature of heat dissipation vapor corresponding to the heat dissipation liquid.

Also in accordance with the disclosure, there is provided an electronic apparatus including an electronic member and a heat dissipation device arranged close to or in contact with the electronic member. The heat dissipation device includes a vapor chamber including a heat absorption plate body, a vacuum cavity, and a heat dissipation area arranged in sequence. The heat absorption plate body is connected to the electronic member. Aa three-dimensional heat dissipation structure is disposed in the vacuum cavity. A gap exists between an end of the heat dissipation structure and an inner wall of the vacuum cavity. A capillary structure is provided at the inner wall of the vacuum cavity and the three-dimensional heat dissipation structure. The capillary structure is configured to accommodate heat dissipation liquid. The heat dissipation area is configured to reduce a temperature of heat dissipation vapor corresponding to the heat dissipation liquid.

BRIEF DESCRIPTION OF THE DRAWINGS

The following drawings are merely examples for illustrative purposes according to various disclosed embodiments and are not intended to limit the scope of the present disclosure. In the drawings, same or similar reference numerals/characters refer to the same or corresponding parts.

REFERENCE NUMERALS

1—Vapor chamber; 11—Heat absorption plate body; 12—Vacuum cavity; 13—Three-dimensional heat dissipation structure; 14—Capillary structure; 15—Heat dissipation groove; 2—Heat generation device; 21—First area; 22—Second area; 3—Liquid cooling plate.

DETAILED DESCRIPTION

Hereinafter, embodiments consistent with the disclosure will be described with reference to drawings. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Figure 1:
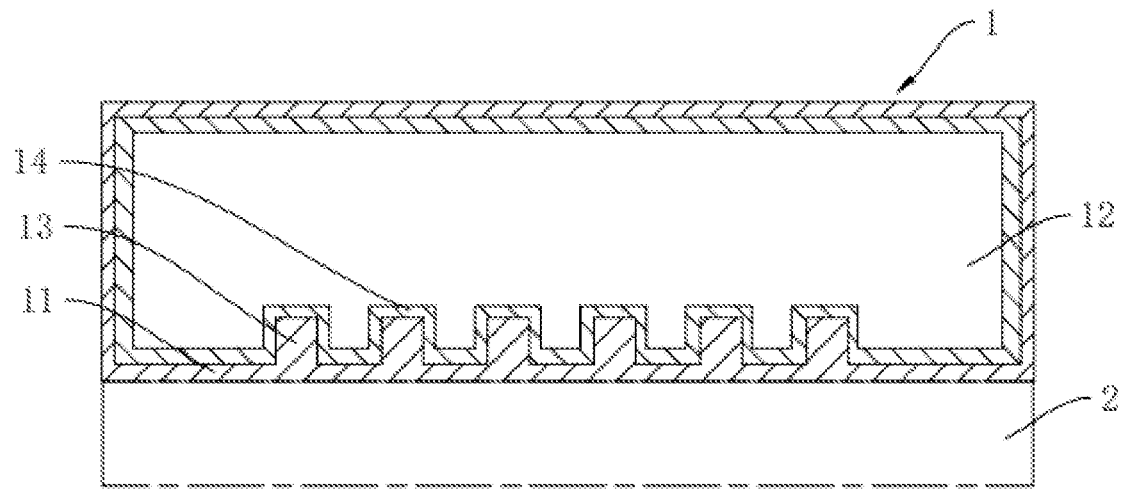
FIG. 1 is a schematic cross-sectional view of a heat dissipation device consistent with the present disclosure.

The present disclosure provides a heat dissipation device. FIG. 1 is a schematic cross-sectional view of a heat dissipation device provided by one embodiment of the present disclosure.

As shown in FIG. 1, in one embodiment, the heat dissipation device includes a vapor chamber 1, and the vapor chamber 1 includes a heat absorption plate body 11, a vacuum cavity 12, and a heat dissipation area arranged in sequence. The heat absorption plate body 11 is used for connecting to a heat generation device 2. At least one three-dimensional heat dissipation structure 13 is provided in the vacuum cavity 12. There is a gap between an end of the at least one three-dimensional heat dissipation structure 13 and an inner wall of the vacuum cavity 12. The inner wall of the vacuum cavity 12 and the at least one three-dimensional heat dissipation structure 13 are provided with a capillary structure 14, and the capillary structure 14 is used for accommodating heat dissipation liquid. The heat dissipation area is used to reduce the temperature of heat dissipation vapor corresponding to the heat dissipation liquid.

In the heat dissipation device provided by the present embodiment, by disposing the at least one three-dimensional heat dissipation structure 13 in the vacuum cavity 12 of the vapor chamber 1, the capillary structure 14 may be disposed on the inner wall of the vacuum cavity 12 and the at least one three-dimensional heat dissipation structure 13, such that an overall volume of the capillary structure 14 may be increased. Correspondingly, the capillary structure 14 may be able to accommodate more heat dissipation liquid, thereby improving the heat dissipation effect of the heat dissipation device.

The heat generation device 2 may be an electronic component inside an electronic apparatus, such as various types of chips. The heat absorption plate body 11 may be a structure connected to the heat generation device 2 on the vapor chamber 1. The heat absorption plate body 11 may be a part of a casing of the vapor chamber 1 and may be integrally formed with the casing of the vapor chamber 1, or may be connected to the casing of the vapor chamber 1 by splicing. The heat absorption plate body 11 may be connected to the heat generation device 2 to conduct the heat of the heat generation device 2 into the vacuum cavity 12 for heat dissipation. The heat absorption plate body 11 may be made of a metal with a good thermal conductivity.

The at least one three-dimensional heat dissipation structure 13 may be a three-dimensional structure arranged in the vacuum cavity 12 and protruding relative to the inner wall of the vacuum cavity 12. The at least one three-dimensional heat dissipation structure 13 may be arranged at any position on the inner wall of the vacuum cavity 12. The at least one three-dimensional heat dissipation structure 13 may be disposed on a surface of the heat absorption plate body 11 in the vacuum cavity 12, such that a surface area of the heat absorption plate body 11 located in the vacuum cavity 12 may be increased and the surface area of the heat absorption plate body 11 on the heat generation device 2 is smaller than the inner surface area of the heat absorption plate body 11 in the vacuum cavity 12. The at least one three-dimensional heat dissipation structure 13 may be fixed on the heat absorption plate body 11, or may be integrally formed with the heat absorption plate body 11 by stamping. There may be a gap between the end of the at least one three-dimensional heat dissipation structure 13 and the inner wall of the vacuum cavity 12 to avoid reducing the total area of the capillary structure 14 due to the contact between the end of the at least one three-dimensional heat dissipation structure 13 and the inner wall of the vacuum cavity 12. Specifically, one end of the at least one three-dimensional heat dissipation structure 13 may be connected to the heat absorption plate body 11, and another end away from the heat absorption plate body 11 may have a gap with the inner wall of the vacuum cavity 12. The capillary structure 14 may cover the inner wall of the vacuum cavity 12 and an outer surface of the at least one three-dimensional heat dissipation structure 13. The capillary structure 14 may include a plurality of fine structures, and the plurality of fine structures may be used for accommodating heat dissipation liquid.

When the heat dissipation device provided by embodiments of the present disclosure is in use, the vapor chamber 1 may be fixedly connected to the heat generation device 2, such that the outer surface of the heat absorption plate body 11 is in contact with the surface of the heat generation device 2. When the heat generation device 2 is working, the heat absorption plate body 11 may conduct the heat of the heat generation device 2 into the vacuum cavity 12 through heat conduction. The vacuum cavity 12 may be a cavity with a low vacuum level. The heat dissipation liquid located in the capillary structure 14 may absorb the heat conducted into the vacuum cavity 12. The heat dissipation liquid may quickly evaporate after absorbing heat, resulting in the phenomenon of liquid phase vaporization and formation of the heat dissipation vapor. The heat dissipation vapor may quickly fill the entire vacuum cavity 12. It can be understood that the temperature of the area in the vacuum cavity 12 away from the heat absorption plate body 11 may be relatively low, that is, the area in the vacuum cavity 12 away from the heat absorption plate body 11 may be the heat dissipation area. When the heat dissipation vapor contacts the cooler heat dissipation area, condensation may occur, and the heat accumulated during evaporation may be released quickly during condensation. The heat dissipation area may be used for heat conduction, and the heat released by the heat dissipation vapor may be conducted to the external environment, to realize the rapid heat dissipation of the heat generation device 2. The heat dissipation vapor may release heat and condense into the heat dissipation liquid, and the heat dissipation liquid may return to the capillary structure 14. Through the recycling of evaporation and condensation of the heat dissipation liquid, the vapor chamber 1 may continue to dissipate the heat of the heat generation device 2. Because of the arrangement of the at least one three-dimensional heat dissipation structure 13, the capillary structure 14 may be able to accommodate more heat dissipation liquid. The more heat dissipation liquid may conduct the heat of the heat generation device 2 to the heat dissipation area rapidly, and the heat dissipation range of the heat dissipation area may be much larger than the heat dissipation range of the heat generation device 2 itself. Therefore the heat dissipation speed may be increased, improving the heat dissipation effect.

In one embodiment, a height of the at least one three-dimensional heat dissipation structure 13 may not exceed two-thirds of the height of the vacuum cavity 12. Specifically, in one embodiment, the height of the at least one three-dimensional heat dissipation structure 13 may be not more than half of the height of the vacuum cavity 12. It can be understood that, during the heat conduction process of the heat absorption plate body 11, the temperature of the area in the vacuum cavity 12 that is farther away from the heat absorption plate body 11 is lower. When the height of the at least one three-dimensional heat dissipation structure 13 is too high, the at least one three-dimensional heat dissipation structure 13 may occupy the space of the heat dissipation area and the end of the three-dimensional heat dissipation structure 13 may be not able to evaporate the heat dissipation liquid due to insufficient heat. Therefore, the heat dissipation effect may not be achieved. Based on this, in the present disclosure, the height of the at least one three-dimensional heat dissipation structure 13 may be configured to not exceed two-thirds of the height of the vacuum cavity 12, such that the heat dissipation liquid of the capillary structure 14 on the at least one three-dimensional heat dissipation structure 13 is able to realize the heat dissipation process of evaporation and condensation. For example, when the height of the vacuum cavity 12 of the vapor chamber 1 is 4 mm, the height of the at least one three-dimensional heat dissipation structure 13 may be selected to be 1-2 mm, and when the height of the vacuum cavity 12 of the vapor chamber 1 is 3 mm, the height of the at least one three-dimensional heat dissipation structure 13 may not exceed 1.5 mm.

Figure 2:
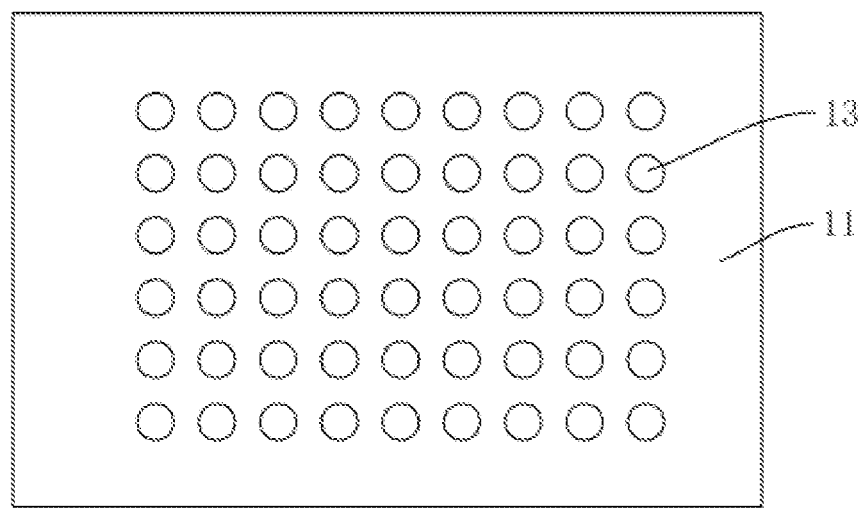
FIG. 2 is a schematic diagram showing an arrangement of three-dimensional heat dissipation structures of a heat dissipation device consistent with the present disclosure.
Figure 3:
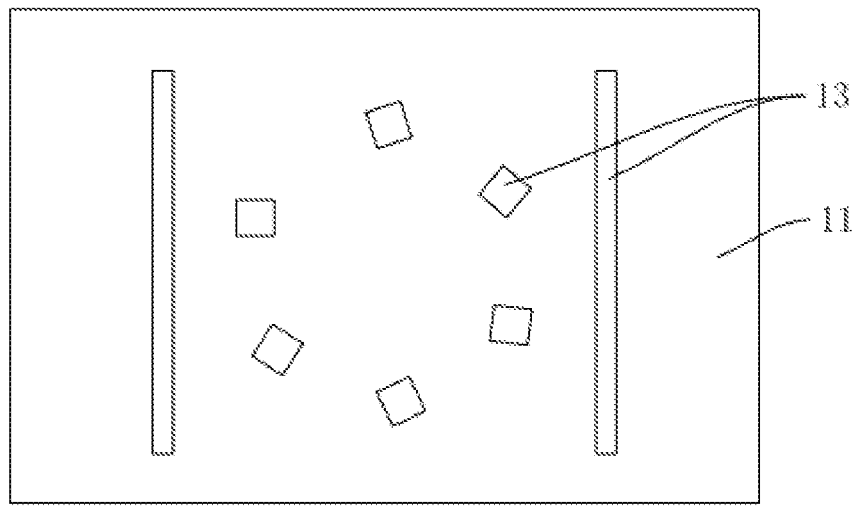
FIG. 3 is a schematic diagram showing an arrangement of three-dimensional heat dissipation structures of another heat dissipation device consistent with the present disclosure.

FIG. 2 is a schematic diagram showing an arrangement of three-dimensional heat dissipation structures of a heat dissipation device consistent with the present disclosure. FIG. 3 is a schematic diagram showing an arrangement of three-dimensional heat dissipation structures of another heat dissipation device consistent with the present disclosure.

As shown in FIG. 2 and FIG. 3, in one embodiment, the at least one three-dimensional heat dissipation structure 13 may be at least one of a fin structure, a column structure, or a spherical structure.

Three-dimensional convex shapes of the at least one three-dimensional heat dissipation structure 13 may include, but are not limited to, fin-shaped, cylindrical, spherical, hemispherical, conical, or other shapes. Moreover, in the same vacuum cavity 12, three-dimensional heat dissipation structures 13 with more than one shape may be arranged and combined. Further, when there are multiple three-dimensional heat dissipation structures 13, the multiple three-dimensional heat dissipation structures 13 may be arranged in various ways, including but not limited to random arrangement, matrix arrangement, ring arrangement, etc. The arrangement methods may also be combined with each other. Further, there may be an interval between adjacent three-dimensional heat dissipation structures 13.

Figure 4:
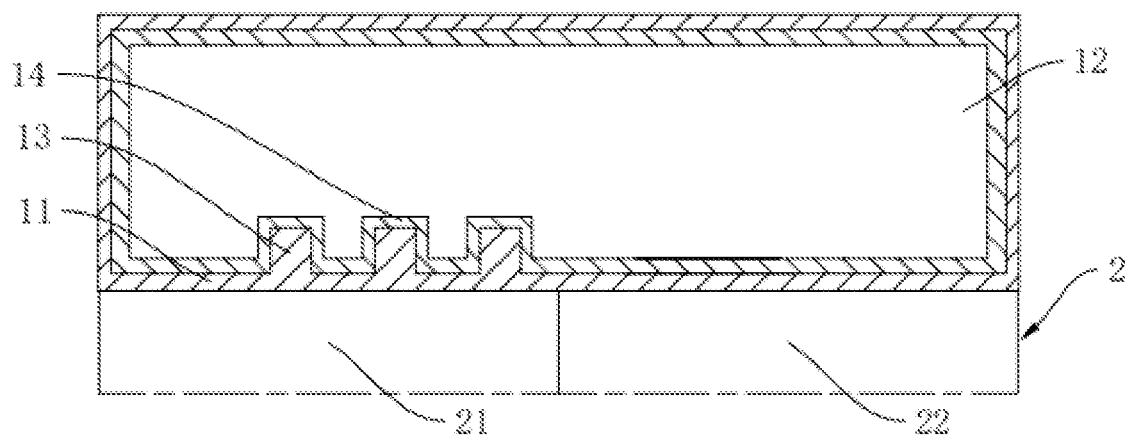
FIG. 4 is a schematic cross-sectional view of another heat dissipation device consistent with the present disclosure.

FIG. 4 is a schematic cross-sectional view of a heat dissipation device according to another embodiment of the present disclosure.

As shown in FIG. 4, in one embodiment, the heat generation device 2 include a first area 21 and a second area 22. The heat dissipation requirement of the first area 21 is greater than that of the second area 22, and three-dimensional heat dissipation structures 13 are disposed at a position corresponding to the first area 21.

When the heat generation device 2 is working, the temperature generated on different parts of the surface may be different, and the specific positions of the three-dimensional heat dissipation structures 13 may be configured according to the heating conditions of the heat generation device 2. In one implementation, the three-dimensional heat dissipation structures 13 may be arranged in areas where the heat dissipation requirement of the heat generation device 2 is relatively large.

Figure 5:
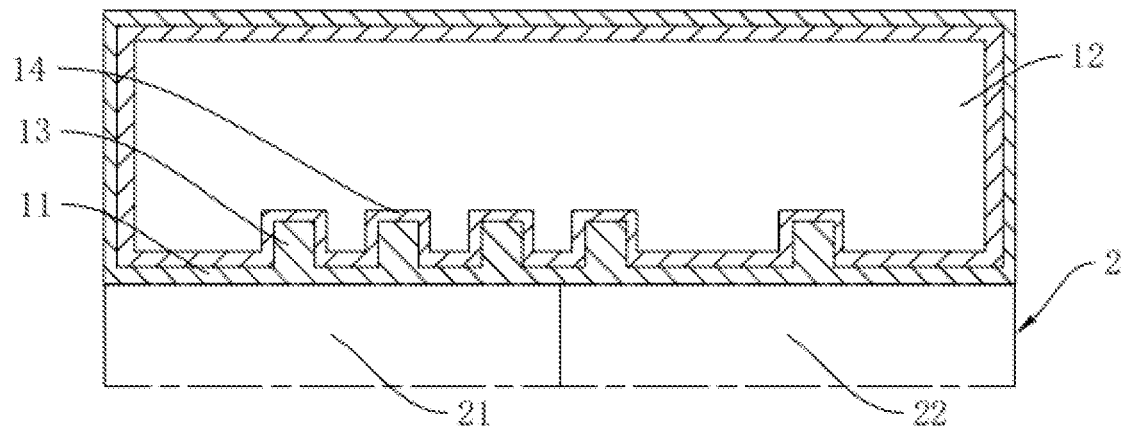
FIG. 5 is a schematic cross-sectional view of another heat dissipation device consistent with the present disclosure.

FIG. 5 is a schematic cross-sectional view of a heat dissipation device according to another embodiment of the present disclosure.

As shown in FIG. 5, in one embodiment, when the overall heat dissipation requirement of the heat generation device 2 is relatively large, the density of the three-dimensional heat dissipation structures 13 may be configured, such that the density of the three-dimensional heat dissipation structures 13 located in the first area 21 is greater than the density of the three-dimensional heat dissipation structures 13 located in the second region 22. The surface of the heat generation device 2 may also be cooled in a targeted manner by adjusting the arrangement of the three-dimensional heat dissipation structures 13.

In one embodiment, the three-dimensional heat dissipation structures 13 may be movably connected to the inner wall of the vacuum cavity 12.

The three-dimensional heat dissipation structures 13 may be movably connected to the inner wall of the vacuum cavity 12 through control of a drive member, such that the three-dimensional heat dissipation structures 13 may move in the vacuum cavity 12 according to the heat dissipation requirements. Therefore, the three-dimensional heat dissipation structures 13 may dissipate heat in a more targeted manner. Specifically, in one embodiment, the temperature of the surface of the heat generation device 2 may be monitored in different regions, and according to the temperature obtained by monitoring, the three-dimensional heat dissipation structures 13 may be controlled to move to an area with a large heat dissipation requirement to cool the area.

Figure 6:
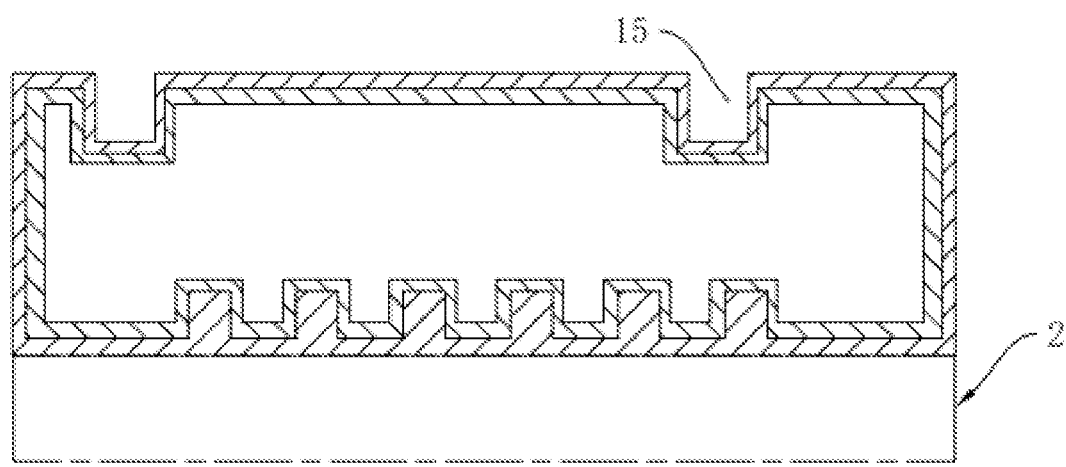
FIG. 6 is a schematic cross-sectional view of another heat dissipation device consistent with the present disclosure.

FIG. 6 is a schematic cross-sectional view of a heat dissipation device according to another embodiment of the present disclosure.

As shown in FIG. 6, in one embodiment, a plurality of heat dissipation grooves 15 are formed at the heat dissipation area.

The heat dissipation area may include the casing of the vapor chamber 1 away from the heat absorption plate body 11. By forming the plurality of heat dissipation grooves 15 on the casing, the contact area between the heat dissipation area and the external environment may be increased, thereby increasing the heat exchange efficiency between the heat dissipation area and the external environment. The heat dissipation speed and the heat dissipation effect of the heat dissipation device may be further improved. It can be understood that the number, shape and arrangement of the plurality of heat dissipation grooves 15 may be adjusted according to the actual situation. The plurality of heat dissipation grooves 15 may include but is not limited to long grooves, square grooves, stepped grooves, conical grooves, circular grooves, etc. The plurality of heat dissipation grooves 15 may also be arranged in a random arrangement, a matrix arrangement, a ring arrangement, or other arrangements.

Further, various types of heat dissipation fins may be connected to the heat dissipation area, that is, the heat dissipation fins may be connected to the casing of the vapor chamber 1. The heat dissipation fins may be used to further improve the heat dissipation efficiency of the vapor chamber.

Figure 7:
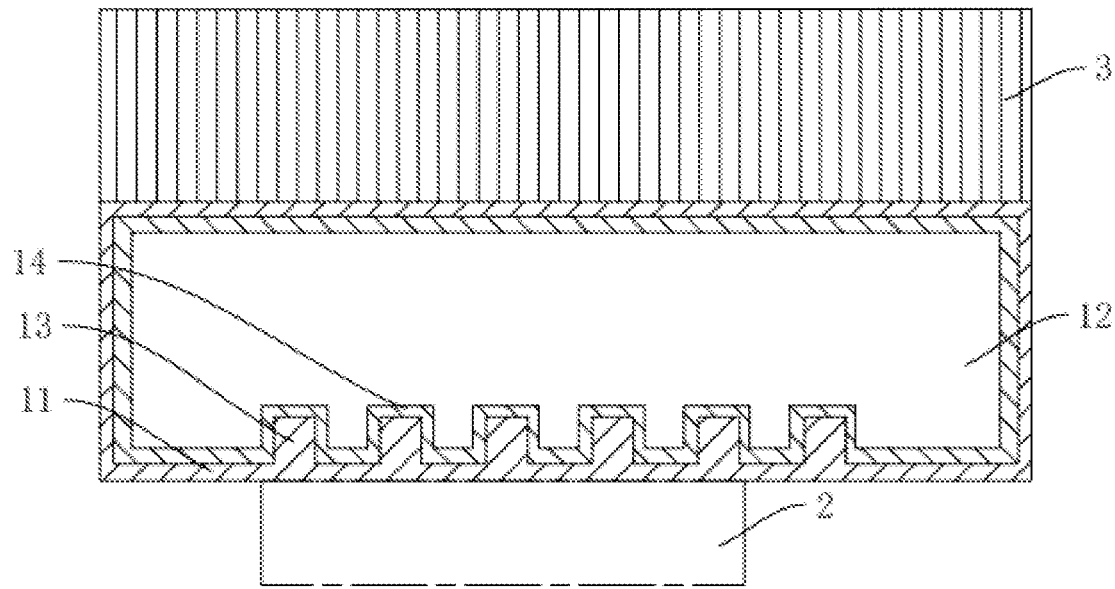
FIG. 7 is a schematic cross-sectional view of another heat dissipation device consistent with the present disclosure.

FIG. 7 is a schematic cross-sectional view of a heat sink according to another embodiment of the present disclosure.

As shown in FIG. 7, in one embodiment, a liquid cooling plate 3 is further connected to the heat dissipation area.

Specifically, the liquid cooling plate 3 may be connected to the casing of the vapor chamber 1. The liquid cooling plate 3 may have a micro-channel structure formed by heat dissipation fins. Using the mechanical characteristics of the micro-channel structure, the heat in the heat dissipation area may be conducted to the liquid cooling plate. 3 and absorbed by the liquid in the internal micro-channel structure of the liquid cooling plate 3. The heat then may enter the external cooling circulation system through the liquid cooling system, and may dissipate to the outdoor. The heat transfer may be enhanced and the strength of convective heat transfer may be increased, thereby taking away the heat of the heat generation device 2 to ensure the operating temperature of the heat generation device 2. Further, the heat dissipation capability of the liquid cooling plate 3 may be controlled by controlling the flow direction and flow rate of the liquid cooling system. By combining the internal micro-channel structure of the liquid cooling plate 3 with the vapor chamber 1, and by flexibly designing the size and distribution of the heat dissipation fins in the micro-channel structure, the heat exchange area may be greatly increased and the heat exchange effect may be improved.

The size of the surface of the vapor chamber connected to the heat generation device 2 may be larger than the surface of the heat generation device 2. For example, size of the surface of the vapor chamber connected to the heat generation device 2 may be more than twice that of the surface of the heat generation device 2. Therefore, the vacuum cavity of the vapor chamber 1 may be used to expand the heat dissipation surface area of the heat generation device 2 at least twice, to break through the bottleneck problem of excessive power density on the surface of the heat generation device 2.

For example, when the heat generation device 2 is a 1000W high-density chip, the surface of the heat generation device 2 may be connected to the vapor chamber 1 whose surface size is twice or three times of the surface of the heat generation device 2, and the heat the vapor chamber 1 may be dissipated by the liquid-cooling plate 3 of the same size. It may be equivalent to that the heat of two 500W chips or three 330W chips is dissipated through the micro-channel structure of the liquid cooling plate. The design requirements of the liquid cooling plate for ultra-high power density chips may be greatly reduced.

In one embodiment, the liquid cooling plate 3 may be connected to the surface of any vapor chamber 1 that needs to improve heat dissipation efficiency. This structure may not limit the internal structure of the vacuum cavity 2 of the vapor chamber 1. It may only need to connect the liquid cooling plate 3 to the surface of the vapor chamber 1, to achieve the heat dissipation of the vapor chamber 1.

Figure 8:
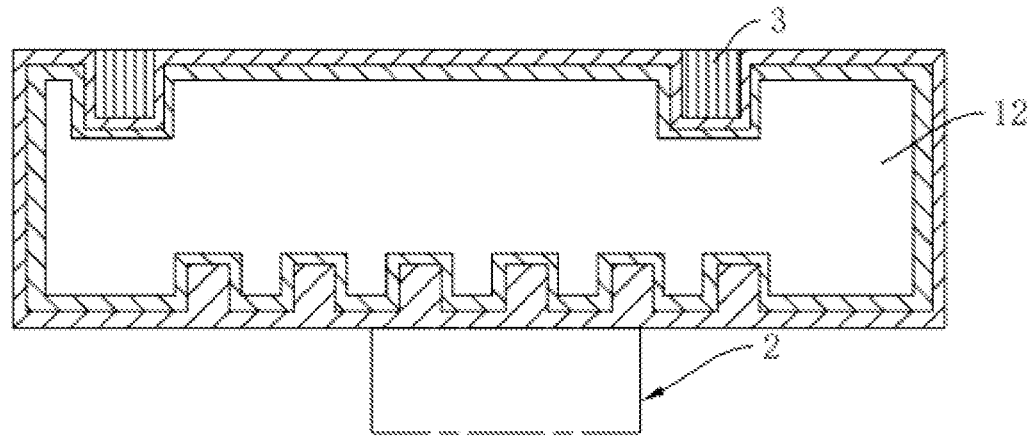
FIG. 8 is a schematic cross-sectional view of another heat dissipation device consistent with the present disclosure.

FIG. 8 is a schematic cross-sectional view of a heat dissipation device according to another embodiment of the present disclosure.

As shown in FIG. 8, in one embodiment, the liquid cooling plate 3 may be embedded in the plurality of heat dissipation grooves 15. By combining the liquid cooling plate 3 with the plurality of heat dissipation grooves 15, the increase of the heat exchange area in the heat dissipation area may be ensured, and the external environment may be rapidly cooled by the liquid cooling plate 3, to meet the cooling requirements.

In one embodiment, the plurality of heat dissipation grooves 15 may be movably connected to the vacuum cavity 12. The shapes, number and depth of the plurality of heat dissipation grooves 15 may be adjusted according to the actual situation. By adjusting the depth of the plurality of heat dissipation grooves 15, the three-dimensional degree of the liquid cooling plate 3 may be changed. When the depth of the plurality of heat dissipation grooves 15 is greater, the liquid cooling plate 3 may be more three-dimensional.

The plurality of heat dissipation grooves 15 may also be movably connected to the vacuum cavity 12 through the control of the drive member. Specifically, the plurality of heat dissipation grooves 15 may be movably connected to the casing of the vapor chamber 1 through the control of the drive member, such that the plurality of heat dissipation grooves 15 may be able to move on the casing of the vapor chamber 1 according to the heat dissipation requirements. In one embodiment, the plurality of heat dissipation grooves 15 may be able to move according to the temperature of the external environment. By monitoring the temperature of the external environment, the plurality of heat dissipation grooves 15 may be controlled to move to a lower temperature area to improve the efficiency of heat exchange. In another embodiment, the plurality of heat dissipation grooves 15 may be able to move with respect to the movable three-dimensional heat dissipation structures 13. By monitoring the position of the three-dimensional heat dissipation structures 13, the plurality of heat dissipation grooves 15 may be controlled to move to the position of the corresponding three-dimensional heat dissipation structures 13. The heat dissipation effect of the three-dimensional heat dissipation structures 13 may be improved. It can be understood that, when the liquid cooling plate 3 is embedded in the plurality of heat dissipation grooves 15, the synchronous movement of the liquid cooling plate 3 may be realized by moving the plurality of heat dissipation grooves 15.

In one embodiment, the liquid cooling plate 3 may be connected to the plurality of heat dissipation grooves 15 on the surface of any vapor chamber 1 that needs to improve the heat dissipation efficiency. This structure may not limit the internal structure of the vacuum cavity 2 of the vapor chamber 1. It may only need to connect the liquid cooling plate 3 to the surface of the vapor chamber 1, to achieve the heat dissipation of the vapor chamber 1.

Another aspect of the present disclosure provides an electronic apparatus. The electronic apparatus may include an electronic element and a heat dissipation device provided by various embodiments of the present disclosure. The heat dissipation device may be close to or in contact with the surface of the electronic element, to dissipate heat from the electronic element.

In the present disclosure, description with reference to the terms "one embodiment," "some embodiments," "example," "specific example," or "some examples," etc., means that specific features, structures, materials, or characters described in connection with the embodiment or example are included in at least one embodiment or example of the present disclosure. Furthermore, the particular features, structures, materials or characteristics described may be combined in any suitable manner in any one or more embodiments or examples. Furthermore, those skilled in the art may combine the different embodiments or examples described in this specification, as well as the features of the different embodiments or examples, as long as they do not conflict with each other.

In the present disclosure, the terms "first" and "second" are only used for descriptive purposes, and should not be understood as indicating or implying relative importance or implying the number of indicated technical features. Thus, a feature associated with "first," "second" may expressly or implicitly include at least one of that feature. In the description of the present disclosure, "plurality" means two or more, unless otherwise expressly and specifically defined.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure.

What is claimed is:

1. A heat dissipation device comprising:
   a vapor chamber including a heat absorption plate body, a vacuum cavity, and a heat dissipation area arranged in sequence;
   wherein:
   the heat absorption plate body is configured to be connected to a heat generation device, the heat generation device including a first area and a second area, heat dissipation requirement of the first area being greater than heat dissipation requirement of the second area;
   a plurality of three-dimensional heat dissipation structures are disposed in the vacuum cavity, a gap existing between an end of each of the plurality of heat dissipation structures and an inner wall of the vacuum cavity, the plurality of three-dimensional heat dissipation structures being arranged at a position corresponding to the first area, no three-dimensional heat dissipation structure being arranged at a position corresponding to the second area, and three-dimensional convex shapes of the plurality of three-dimensional heat dissipation structures including at least two of a fin shape, a cylindrical shape, a spherical shape, a hemispherical shape, or a conical shape;

a capillary structure is provided at the inner wall of the vacuum cavity and the plurality of three-dimensional heat dissipation structures, the capillary structure being configured to accommodate heat dissipation liquid;

the heat dissipation area is configured to reduce a temperature of heat dissipation vapor corresponding to the heat dissipation liquid;

the heat absorption plate body includes a first side and a second side opposite to the first side;

the first side of the heat absorption plate body is in contact with the heat generation device;

the second side of the heat absorption plate body is provided with a plurality of heat dissipation grooves, a portion of the second side under at least one of the plurality of heat dissipation grooves protruding towards the vacuum cavity, and the plurality of heat dissipation grooves being arranged in a circle or a matrix; and a liquid cooling plate is connected to the heat dissipation area, and the liquid cooling plate is embedded in at least one of the plurality of heat dissipation grooves.

2. The heat dissipation device according to claim 1, wherein a height of the plurality of three-dimensional heat dissipation structures does not exceed two-thirds of a height of the vacuum cavity.

3. The heat dissipation device according to claim 1, wherein:
the plurality of three-dimensional heat dissipation structures are connected to the inner wall of the vacuum cavity.

4. The device according to claim 1, wherein:
the plurality of heat dissipation grooves are connected to the vacuum cavity.

5. An electronic apparatus comprising:
an electronic member; and
a heat dissipation device arranged close to or in contact with the electronic member, the heat dissipation device including:
a vapor chamber including a heat absorption plate body, a vacuum cavity, and a heat dissipation area arranged in sequence, wherein:
the heat absorption plate body is connected to the electronic member, the electronic member including a first area and a second area, heat dissipation requirement of the first area being greater than heat dissipation requirement of the second area;
a plurality of three-dimensional heat dissipation structures are disposed in the vacuum cavity, a gap existing between an end of each of the plurality of heat dissipation structures and an inner wall of the vacuum cavity, the plurality of three-dimensional heat dissipation structures being arranged at a position corresponding to the first area, no three-dimensional heat dissipation structure being arranged at a position corresponding to the second area, and three-dimensional convex shapes of the plurality of three-dimensional heat dissipation structures including at least two of a fin shape, a cylindrical shape, a spherical shape, a hemispherical shape, or a conical shape;

a capillary structure is provided at the inner wall of the vacuum cavity and the plurality of three-dimensional heat dissipation structures, the capillary structure being configured to accommodate heat dissipation liquid;

the heat dissipation area is configured to reduce a temperature of heat dissipation vapor corresponding to the heat dissipation liquid;

the heat absorption plate body includes a first side and a second side opposite to the first side;

the first side of the heat absorption plate body is in contact with the heat generation device;

the second side of the heat absorption plate body is provided with a plurality of heat dissipation grooves, a portion of the second side under at least one of the plurality of heat dissipation grooves protruding towards the vacuum cavity, and the plurality of heat dissipation grooves being arranged in a circle or a matrix; and a liquid cooling plate is connected to the heat dissipation area, and the liquid cooling plate is embedded in at least one of the plurality of heat dissipation grooves.

6. The electronic apparatus according to claim 5, wherein a height of the plurality of three-dimensional heat dissipation structures does not exceed two-thirds of a height of the vacuum cavity.

7. The electronic apparatus according to claim 5, wherein:
the plurality of three-dimensional heat dissipation structures are connected to the inner wall of the vacuum cavity.

8. The electronic apparatus according to claim 5, wherein:
the plurality of heat dissipation grooves are connected to the vacuum cavity.

9. The heat dissipation device according to claim 1, wherein:
a top surface of the liquid cooling plate being coplanar with a top surface of the heat absorption plate body.

10. The heat dissipation device according to claim 1, wherein:
the liquid cooling plate includes a micro-channel structure formed by heat dissipation fins.

11. The heat dissipation device according to claim 1, wherein:
the at least one of the plurality of heat dissipation grooves is arranged at a position corresponding to the heat dissipation area, the heat dissipation area being an area in the vacuum cavity away from the heat absorption plate body and with a temperature lower than the temperature of the heat dissipation vapor.

12. The heat dissipation device according to claim 1, wherein the plurality of three-dimensional heat dissipation structures are arranged in a circle.

13. A heat dissipation device comprising:
a vapor chamber including a heat absorption plate body, a vacuum cavity, and a heat dissipation area arranged in sequence;
wherein:
the heat absorption plate body is configured to be connected to a heat generation device, the heat generation device including a first area and a second area, heat dissipation requirement of the first area being greater than heat dissipation requirement of the second area;

a plurality of three-dimensional heat dissipation structures are disposed in the vacuum cavity, a gap existing between an end of each of the plurality of heat dissipation structures and an inner wall of the vacuum cavity, the plurality of three-dimensional heat dissipation structures being arranged at a position corresponding to the first area, no three-dimensional heat dissipation structure being arranged at a position corresponding to the second area, and three-dimensional convex shapes of the plurality of three-dimensional heat dissipation structures including at least two of a fin shape, a cylindrical shape, a spherical shape, a hemispherical shape, or a conical shape;

a capillary structure is provided at the inner wall of the vacuum cavity and the plurality of three-dimensional heat dissipation structures, the capillary structure being configured to accommodate heat dissipation liquid;

the heat dissipation area is configured to reduce a temperature of heat dissipation vapor corresponding to the heat dissipation liquid;

the heat absorption plate body includes a first side and a second side opposite to the first side;

the first side of the heat absorption plate body is in contact with the heat generation device;

the second side of the heat absorption plate body is provided with a plurality of heat dissipation grooves, a portion of the second side under at least one of the plurality of heat dissipation grooves protruding towards the vacuum cavity, and the plurality of heat dissipation grooves being arranged in a circle or a matrix; and a liquid cooling plate is embedded in at least one of the plurality of heat dissipation grooves, and a top surface of the liquid cooling plate is coplanar with a top surface of the heat absorption plate body.

* * * * *